United States Patent [19]

Yatsuo et al.

[11] 3,967,308
[45] June 29, 1976

[54] SEMICONDUCTOR CONTROLLED RECTIFIER

[75] Inventors: Tsutomu Yatsuo; Tatsuya Kamei; Takuzo Ogawa; Tomoyuki Tanaka, all of Hitachi, Japan

[73] Assignee: Hitachi, Ltd., Hitachi, Japan

[22] Filed: Mar. 15, 1974

[21] Appl. No.: 451,679

Related U.S. Application Data

[63] Continuation of Ser. No. 293,097, Sept. 28, 1972, abandoned.

[30] Foreign Application Priority Data

Oct. 1, 1971  Japan ................................ 46-76343
Oct. 4, 1971  Japan ................................ 46-77098

[52] U.S. Cl. .................................. 357/38; 357/39; 357/55; 357/86
[51] Int. Cl.² ......................................... H01L 29/74
[58] Field of Search ............. 317/235 AE, 235 AB; 357/38, 39, 86, 55

[56] References Cited
UNITED STATES PATENTS

| | | | |
|---|---|---|---|
| 3,360,696 | 12/1967 | Neilson et al. ........................ | 317/235 |
| 3,391,310 | 7/1968 | Gentry .................................. | 317/235 |
| 3,408,545 | 10/1968 | De Cecco et al. ................... | 317/235 |
| 3,443,171 | 5/1969 | Knott et al. ............................ | 357/39 |
| 3,476,989 | 11/1969 | Miles et al. .......................... | 317/235 |
| 3,489,962 | 1/1970 | McIntyre et al. ...................... | 357/38 |
| 3,549,961 | 12/1970 | Gault .................................... | 317/235 |
| 3,566,211 | 2/1971 | Svedberg ............................. | 317/235 |
| 3,577,046 | 5/1971 | Moyson ........................... | 317/235 R |
| 3,622,845 | 11/1971 | McIntyre et al. ...................... | 357/38 |
| 3,629,667 | 12/1971 | Lubart et al. .......................... | 357/86 |
| 3,681,667 | 8/1972 | Kokosa ........................... | 317/235 R |
| 3,700,982 | 10/1972 | Weinstein ....................... | 317/235 R |

*Primary Examiner*—Stanley D. Miller, Jr.
*Assistant Examiner*—Joseph E. Clawson, Jr.
*Attorney, Agent, or Firm*—Craig & Antonelli

[57] ABSTRACT

A thyristor with a gate electrode formed on the side of an anode electrode. An auxiliary region of a large lateral resistance is formed in a surface layer of the substrate between the anode and gate electrodes.

8 Claims, 15 Drawing Figures

SEMICONDUCTOR CONTROLLED RECTIFIER

This is a continuation of application Ser. No. 293,097, filed Sept. 28, 1972, now abandoned.

BACKGROUND OF THE INVENTION

1. Field of the Invention

This invention relates to a semiconductor controlled rectifier, and more specifically to an improved thyristor.

2. Description of the Prior Art

Reverse blocking three-terminal thyristors, which comprise a semiconductor substrate consisting of four successive layers of respectively p-type, n-type, p-type and n-type and are provided with an anode and a cathode electrodes in low resistance contact with the respective end p-type and n-type layers and a gate electrode provided on an intermediate layer near the cathode electrode, are well known in the art. This type of thyristors can be switched from the forward blocking state (high resistivity state) into the conduction state by applying a relatively small control signal voltage between the gate electrode and cathode electrode such that the gate electrode assumes a positive potential with respect to the cathode. One of their most important merits is that they can control extremely large power compared to the power supplied to their gate circuit.

In the above thyristors (hereinafter referred to as cathode gate thyristors), the gate electrode is formed in the neighborhood of the cathode electrode, and a control signal voltage is applied between the cathode and gate electrodes. There is another type of thyristor (hereinafter referred to as anode gate thyristor), in which the gate electrode is formed in the neighborhood of the anode electrode, and a control signal voltage is applied between the anode and gate electrodes. These latter thyristors have found to be useful in some cases. For example, in a conventional phase control circuit for supplying controlled a-c power to a load, which uses two reverse blocking three-terminal thyristors (cathode gate thyristors) connected in parallel and in opposite polarities to each other, the individual thyristors are provided with separate gate circuits. If one of the two thyristors in the above circuit is replaced with an anode gate thyristor, only a single gate circuit may be provided commonly for both the thyristors to simplify the overall circuit construction.

In another aspect, an anode gate thyristor may be fabricated as an element of a bilateral three-terminal thyristor, which is formed in a single semiconductor substrate and can fulfill the function of two thyristors connected in parallel and in opposite polarities to each other. In this case, the characteristics, particularly switching characteristic, of the element can be improved.

Such an anode gate thyristor is usually thought to be obtained simply by reversing the conductivity type of the respective four layers of the cathode gate thyristor substrate. In this case, the gate electrode is connected to the base layer adjacent to the anode emitter. However, it is extremely difficult to realize such an anode gate thyristor from the grounds to be described hereinafter.

Usually, almost all commercially available thyristors use a high resistivity semiconductor of n-type conductivity as the semiconductor substrate. In the anode gate thyristor, the n-type base layer adjacent to the p-type emitter layer has a highest resistivity among the four layers. In this structure, the p-n junction between the p-type emitter layer and n-type base layer, which acts as emitter junction of an equivalent transistor contained in the thyristor, should also act to withstand the reverse voltage across the thyristor. Therefore, in the anode gate thyristor structure where the gate electrode is formed in ohmic contact with the base layer, not only the gate sensitivity is inferior but also the breakdown voltage is low. These disadvantages can be overcome if a p-type semiconductor substrate is used. However, it is well known that with a p-type semiconductor substrate the formation of a base layer of a high resistivity would encounter many difficulties.

SUMMARY OF THE INVENTION

An object of the invention is to provide a novel thyristor, which has a gate electrode provided in the neighborhood of an anode electrode, and which can be turned on by impressing a control signal voltage between the anode and gate electrodes.

Another object of the invention is to provide a novel bilateral three-terminal thyristor structure having two equivalent thyristors formed in a single semiconductor substrate and connected in parallel and in opposite polarities to each other.

A further object of the invention is to provide a novel anode gate thyristor, which can be turned on with small control signal current.

A still further object of the invention is to provide a novel anode gate thyristor, which can be turned on irrespective of the polarity of the control signal voltage.

A yet further object of the invention is to provide a novel anode gate thyristor, in which the control signal voltage may be increased so as to prevent it from being erroneously turned on due to noise voltage from a gate circuit.

The above and other objects will become more apparent from the description of preferred embodiments of the invention having reference to the accompanying drawings.

DESCRIPTION OF THE PREFERRED EMBODIMENTS

A semiconductor controlled rectifier featured by the invention comprises a semiconductor substrate consisting of a stack of at least four layers, each layer being contiguous to and of opposite conductivity to the next layer, an anode electrode formed on a superficial layer of the substrate, a gate electrode formed on the same superficial layer as for the anode electrode and spaced from the anode electrode, an auxiliary region formed in said superficial layer between the anode and gate electrodes. With this structure, by causing control signal current to pass between the anode and gate electrodes a lateral potential gradient is produced across the auxiliary region, so that the unit may be turned on.

Figure 1:
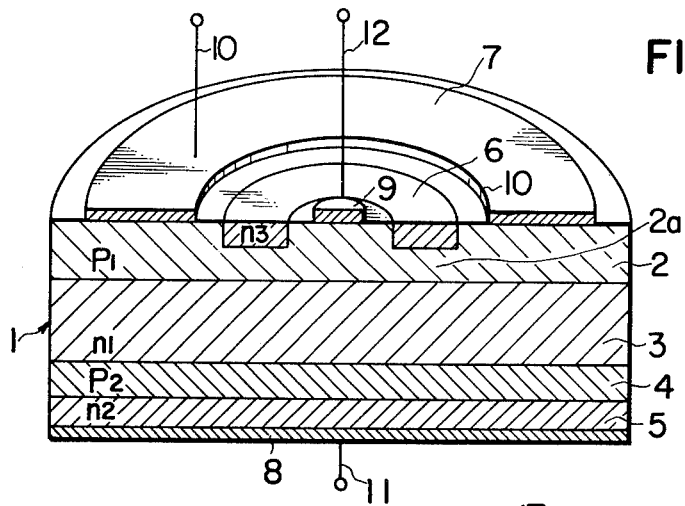
FIG. 1 is a pictorial perspective view of a section of a reverse-current blocking three-terminal thyristor emobodying the invention.

Referring now to FIG. 1, which shows a reverse blocking three-terminal thyristor embodying the invention, reference numeral 1 generally designates a disc-like semiconductor substrate consisting of a first p-type layer 2 ($p_1$ layer), a first n-type layer 3 ($n_1$ layer), a second p-type layer 4 ($p_2$ layer) and a second n-type layer 5 ($p_2$ layer). These layers are successively laminated or stacked together, with one layer contiguous to the adjacent layer. A ring-like metal layer serving as anode electrode 7 is formed atop the $p_1$ layer 2. Also formed atop the $p_1$ layer 2 and surrounded by and spaced from the anode electrode 7 is a gate electrode 9 in ohmic contact with the $p_1$ layer 2. A third n-type layer 6 ($n_3$) of a ring-like form is formed in a superficial portion of the $p_1$ layer 2 between and spaced from the anode and gate electrodes 7 and 9. With this $n_3$ layer 6, an auxiliary region 2a of a large lateral resistance is formed in the $p_1$ layer 2. The surface of the $n_2$ layer 5 is covered with a metal layer serving as cathode electrode 8. Numerals 10, 11 and 12 respectively designate an anode terminal, a cathode terminal and a gate terminal.

Figure 2:
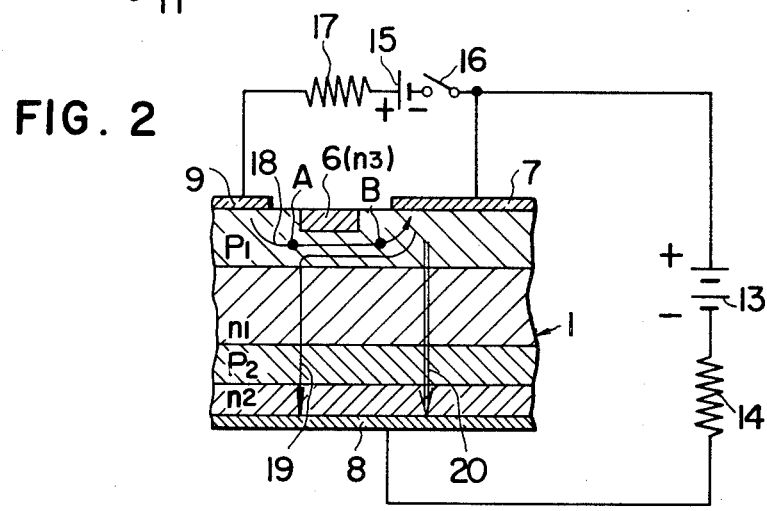
FIG. 2 is a schematic illustration of the operation of the thyristor of FIG. 1.

FIG. 2 shows the operation of the thyristor of FIG. 1. Referring to the Figure, a main power supply 13 and a load resistor 14 are connected in series between the anode and cathode electrodes 7 and 8 of the thyristor. The p-n junction between $p_1$ and $n_1$ layers and the p-n junction between $p_2$ and $n_2$ layers are forwardly biased, and the n-p junction between $n_1$ and $p_2$ layers is reversely biased. Thus, the thyristor is held in its forward blocking state. A control signal source 15, a current limiting resistor 17 and a switch 16 are serially inserted between the anode and gate electrodes 7 and 9 of the thyristor. When the switch 16 is closed, lateral current is caused to flow in the direction of arrow 18 from the gate electrode 9 to the anode electrode 7. As the lateral current passes through part of the $p_1$ layer between the $n_1$ and $n_3$ layers, i.e., the auxiliary region providing a lateral resistance, a voltage drop, and hence a lateral potential gradient is produced between points A and B. As a result, hole injection takes place in part of the p-n junction between $p_1$ and $n_1$ layers in the vicinity of point A of a relatively high potential. The injected holes are diffused through the $n_1$ layer to reach the $p_2$ layer, thus increasing the potential of the $p_2$ layer. With increase in the potential of the $p_2$ layer, injection of electrons through the p-n junction between $p_2$ and $n_2$ layers is promoted. As the injected electrons reach the $n_1$ layer, the potential thereof is reduced, which has the effect of further promoting the injection of holes through the p-n junction between $p_1$ and $n_1$ layers. The above sequence of internal positive feedback actions takes place almost instantaneously. As a result, the n-p junction between $n_1$ and $p_2$ layers, which has previously been reversely biased, is switched into the forward bias state, and local current 19 develops the main current 20. This means that the thyristor, which has previously been in the forward blocking state, is brought into conduction state, that is, it is "turned on".

In the above sequence, the local current 19 plays the role of aiding in the turning-on or ignition of the thyristor. As the current 19 flows laterally through the lateral resistance region of the $p_1$ layer in the opposite direction to the direction of the current 18, the potential in the vicinity of point B is accordingly increased. Thus, subsequent to the initiation of the hole injection through the $p_1$-$n_1$ junction in the vicinity of point A, hole injection also begins in the vicinity of point B, which facilitates the development of the main current 20. At this time, the greater the rising ($di/dt$) of the main current the sooner is the voltage drop produced due to the local current 19. This means that the greater the rising of the main current, the shorter the time required for the local current 19 to develop into the main current 20. In the thyristor of the construction of FIG. 1, the main current is distributed along the anode electrode 7, so that there is no worry about the concentration of current (in the initial turn-on stage) that is usually likely to result when $di/dt$ is increased.

As has been shown, the above thyristor embodying the invention is capable of being turned on by causing a signal current between the anode and gate electrodes. Also, the capability of increasing the rising rate $di/dt$ is obtained as an auxiliary effect. Further, since no gating means is provided in the $n_1$ layer, the gate sensitivity and reverse breakdown voltage will not be reduced.

Figure 3:
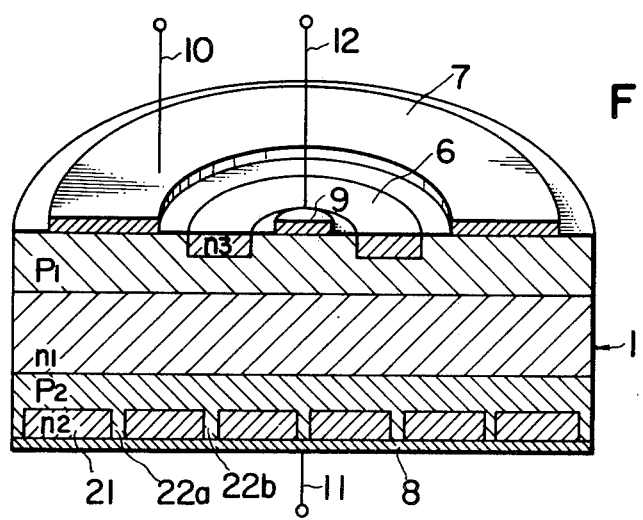
FIG. 3 is a pictorial perspective view of a section of another embodiment of the invention.

FIG. 3 shows a modification of the reverse blocking three-terminal thyristor of FIG. 1. This modification is different from the thyristor of FIG. 1 in that a layer or layers 21 ($n_2$) are formed in the $p_2$ layer such that part (22a, 22b) of the $p_2$ layer is contiguous to the cathode electrode 8, that is, the $p_2$ layer and $n_2$ layer or layers are short-circuited by the cathode electrode 8. With this structure, which is the commonly termed short emitter structure, the breakover characteristic can be improved. The turn-on mechanism is the same as in the previous embodiment.

While the thyristors shown in FIGS. 1 and 3 are of the center gate type, the locality of the gate electrode is not limited. For example, similar effects can be expected with a structure which has a peripheral gate electrode.

Figure 4:
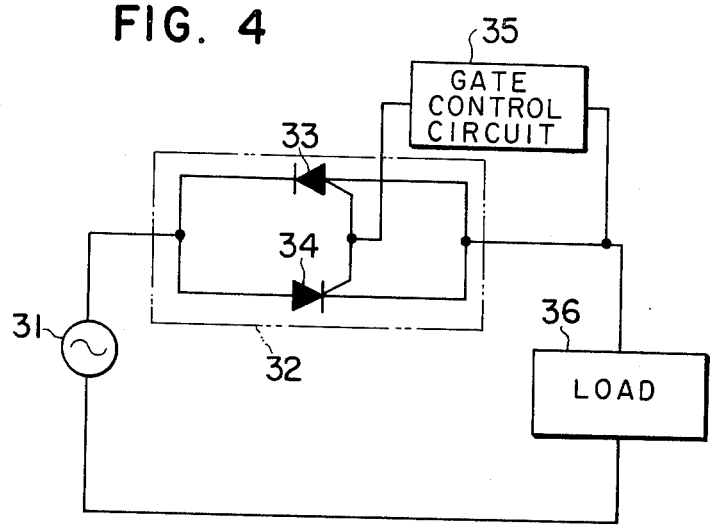
FIG. 4 is a schematic showing of an a-c power control circuit using a thyristor according to the invention.

FIG. 4 shows an a-c power control circuit, in which the thyristors as previously described may be advantageously employed. With this circuit, the power of an a-c power source 31 is supplied to a load 36 through phase control by two thyristors 33 and 34 connected in parallel and in opposite polarities to each other. The thyristor 34 is a prior-art cathode gate thyristor, while the thyristor 33 is an anode gate thyristor according to the invention. These reverse blocking thyristors 33 and 34 have their gate electrodes connected in common, and a single gate control circuit 35 is connected between the common gate juncture and the juncture between the anode electrode of the thyristor 33 and the cathode electrode of the thyristor 34.

This a-c power control circuit, unlike the prior-art circuit, does not require two gate circuits, but the sole gate circuit 35 suffices. In this way, the thyristor according to the invention is useful in simplifying the circuit construction.

Figure 5:
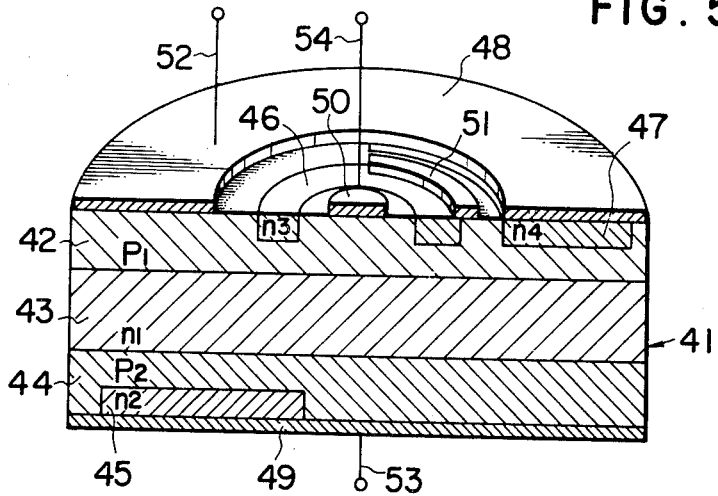
FIG. 5 is a pictorial perspective view of a section of a bilateral three-terminal thyristor embodying the invention.

FIG. 5 shows a section taken along the main current direction of an a-c switching element (bilateral three-terminal thyristor) as a modification of the thyristor of FIG. 1. With this bilateral thyristor, the parallel opposite-polarity thyristor circuit in the a-c power control circuit 32 of FIG. 4 can be realized in a single semiconductor substrate 41. The anode gate thyristor 33 is realized in the left hand half of the substrate 41, while the cathode gate thyristor 34 is realized in the right hand half of the substrate 41. The substrate 41 includes a first p-type layer 42 ($p_1$ layer) contiguous to a first n-type layer 43 ($n_1$ layer) contiguous to a second p-type layer 44 ($p_2$ layer). A second n-type layer 45 ($n_2$ layer) is formed in a superficial portion of the $p_2$ layer. A fourth n-type layer ($n_4$ layer) of a semi-ring-like form is formed in a superficial portion of the $p_1$ layer 42 over a portion of the $p_2$ layer 44 not containing the $n_2$ layer. A ring-like metal layer serving as a first main electrode 48 is formed on one principal surface of the disc-like substrate 41 such as to short-circuit the $p_1$ and $n_4$ layers. Another metal layer serving as a second main electrode 49 is formed to entirely cover the other principal surface of the substrate 41 such as to short-circuit the $p_2$ and $n_2$ layers. Formed atop the $p_1$ layer 42 and surrounded and spaced from the main electrode 48 is a gate electrode 50 in ohmic contact with the $p_1$ layer. A third n-type layer 46 ($n_3$ layer) of a ring-like form in a superficial portion of the $p_1$ layer between and spaced from the first main electrode 48 and gate electrode 50. The $n_3$ and $p_1$ layers are short-circuited with a short-circuiting conductive layer 51 formed on and bridging the $n_3$ and $p_1$ layers. To the individual electrodes 48, 49 and 50 respective lead terminals 52, 53 and 54 are connected.

The operation of the left hand half of the bilateral thyristor of the above construction is the same as that of the reverse blocking three-terminal thyristor described earlier in connection with FIG. 2, since the first main electrode 48 is held at a positive potential, the second main electrode 49 is held at a negative potential and a positive control signal voltage positive with respect to the first main electrode 48 is given to the gate electrode 50. In the operation of the right hand half of the bilateral thyristor, with the main electrodes 48 and 49 respectively biased negatively and positively, by impressing a trigger voltage positive with respect to the gate electrode 50 control signal current passes through the gate electrode 50, $p_1$ layer 42, $n_3$ layer 46, conductive layer 51, $n_4$ layer 47 and main electrode 48. The ignition begins in the neighborhood of the $n_3$ layer 46, and then ignition occurs in the neighborhood of the $n_4$ layer 47 serving as main emitter. This is the so-called amplifying gate structure, but the gate structure of the right hand half thyristor is not limited to this structure. For example, a gate structure where the p-n junction between $p_1$ and $n_4$ layers is forwardly biased directly with a control signal will suffice. In the above manner, the a-c switching is made possible with the bilateral thyristor, so this bilateral thyristor may be used in place of the circuit 32 in the a-c power control circuit of FIG. 4. The above bilateral thyristor is so simple that its inner structure can be regarded to consist of left and right separate thyristors. Thus, the internal interference between the two thyristors is slight, and the commutation characteristic is satisfactory. Further, compared to the prior-art bilateral three-terminal thyristor the rising rate $di/dt$ is extremely large, so that the above bilateral thyristor is useful for large power and high speed switching units.

The thyristors described above according to the invention requires no special manufacturing technique, but they may be fabricated with slight modifications in the prior-art diffusion, deposition and photoetching processes (for instance, modifications in the diffusion mask pattern).

For example, the thyristors of FIGS. 1, 3 and 5 can be fabricated in the following manner.

An n-type silicon single crystal substrate with resistivity of 10 ohm·cm is used, and gallium as acceptor impurity is diffused by a well-known method into the substrate from opposite sides thereof, thereby forming $p_1$ and $p_2$ layers with surface impurity concentration of $10^{18}$ atoms/cm$^3$ and diffusion depth of 50 microns to leave $n_1$ layer sandwitched between the $p_1$ and $p_2$ layers. This silicon substrate is then heated in water vapor to form a silicon oxide layer ($SiO_2$) to a thickness of 1 micron on the substrate surface. Then, apertures or windows of predetermined shapes are formed in the $SiO_2$ layer at predetermined positions thereof by the well-known photoetching technique for the subsequent donor impurity diffusion. Thereafter, phosphorus is selectively diffused with the $SiO_2$ layer used as selective diffusion mask, thus obtaining $n_2$ and $n_3$ layers. As the impurity source may be used, for instance, $POCl_3$, and the diffusion can be done in two steps of impurity deposition and impurity drive-in. During this diffusion, a new $SiO_2$ film is formed to close all the afore-mentioned apertures or windows. The phosphorus diffusion layer thus formed may be such that its diffusion depth is 20 microns and its surface impurity concentration is about $10^{20}$ atoms/cm$^3$. Then, the $SiO_2$ film is partly removed by the photoetching technique to expose predetermined portion of the substrate for the formation of the electrodes. Then, electrode sets each of a main electrode pair and a gate electrode are formed by vacuum deposition of gold on the exposed portions of the substrate. Afterwards, the silicon wafer is divided into pellets individually including respective thyristor elements by means of photoetching with a suitable mask. In the above manner, the thyristor structures of FIGS. 1, 3 and 5 can be obtained. Thereafter, the pellets are set within predetermined capsules, and after necessary inner wiring the capsules are sealed, thus completing the desired thyristors.

In the reverse blocking three-terminal thyristors of FIGS. 1 and 3 or in the bilateral three-terminal thyristor of FIG. 5, the auxiliary region has been formed by forming the third n-type layer 6 or 46. The same end may be achieved by forming a recess in place of the n-type layer.

A further embodiment of the invention will now be described in connection with FIGS. 6 and 7.

Figure 6:
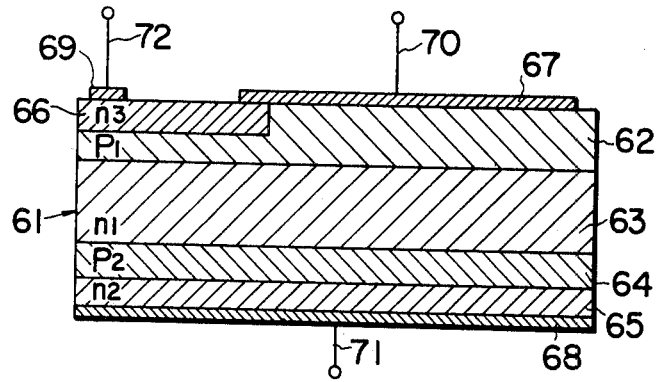
FIG. 6 is a pictorial sectional view showing a different embodiment of the reverse blocking three-terminal thyristor according to the invention.

Referring to FIG. 6, which shows a reverse blocking three-terminal thyristor embodying the invention, reference numeral 61 generally designates a semiconductor substrate, which consists of a first p-type layer 62

($p_1$ layer), a first n-type layer 63 ($n_1$ layer), a second p-type layer 64 ($p_2$ layer) and a second n-type layer 65 ($n_2$ layer). These layers are successively stacked, with one layer contiguous to the next layer. A metal layer serving as anode electrode 67 is formed atop the $p_1$ layer. A third n-type layer 66 ($n_3$ layer) is formed in a superficial portion of the $p_1$ layer partly contiguous to the anode electrode 67. A gate electrode 69 is formed atop the $n_3$ layer 66 and spaced from the anode electrode 67. A metal layer serving as cathode electrode 68 is formed on the entire surface of the $n_2$ layer 65. Numerals 70, 71 and 72 respectively designate an anode terminal, a cathode terminal and a gate terminal. The $n_3$ layer 66 constitutes an auxiliary region serving as a lateral resistance path.

Figure 7:
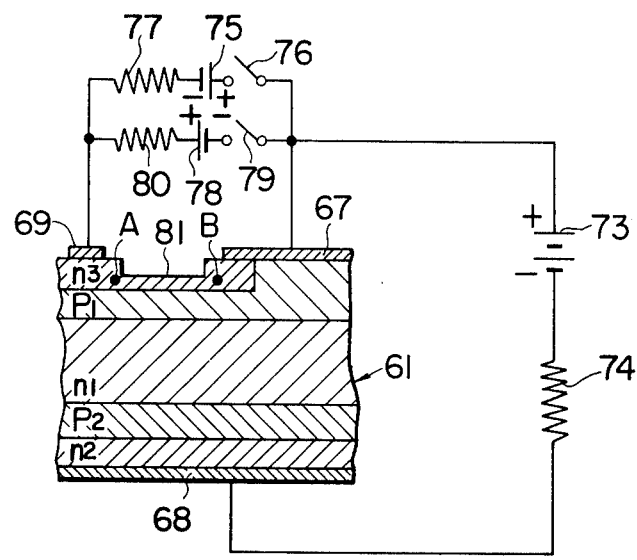
FIG. 7 is a schematic illustration of the operation of a modification of the thyristor of FIG. 6.

FIG. 7 shows an improvement over the thyristor structure of FIG. 6. In the improvement structure, a recess 81 is formed in a superficial portion of the $n_3$ layer between the anode electrode 67 and gate electrode 69. This recess 81 is effective for increasing the lateral resistance of the auxiliary region.

The operation of the thyristor according to the invention will now be described in connection with FIG. 7. A main power supply 73 and a load resistance 74 is connected in series between the anode and cathode electrodes 67 and 68. A first series circuit consisting of a switch 76, a trigger voltage source 75 and a current limiting resistor 77 and a second series circuit consisting of a switch 79, a trigger voltage source 78 and a current limiting resistor 80 are connected in parallel between the gate and anode electrode 69 and 67. The polarities of the voltage sources 75 and 78 are opposite from each other. Although two trigger circuits of opposite polarities are shown, this is because there are two ignition modes in the thyristor of the instant embodiment, but this does not mean that two trigger voltage sources are necessary for the thyristor according to the invention.

A first ignition mode of this thyristor occurs when closing the switch 76 in the first series circuit. The p-n junction between the $p_1$ and $n_1$ layers and the p-n junction between the $p_2$ and $n_2$ layers in the thyristor connected to the main power supply 73 are forwardly biased, while the n-p junction between the $n_1$ and $p_2$ layers is reversely biased. Thus, the thyristor is held in the forward-current blocking state. When the switch 76 is closed, a trigger voltage negative with respect to the anode electrode 67 is impressed upon the gate electrode 69, causing current to pass laterally through the $n_3$ layer from the anode electrode 67 to the gate electrode 69. As a result, a voltage drop, and hence a lateral potential gradient, is produced between points A and B by virtue of the lateral resistance of the auxiliary region in the $n_3$ layer, so that injection of electrons from the $n_3$ layer into the adjacent $p_1$ layer takes place in the vicinity of point A of a relatively low potential. The injected electrons pass through the $p_1$ layer to reach the $n_1$ layer, thus reducing the potential of the $n_1$ layer. As a result, the forward bias across the p-n junction between $p_1$ and $n_1$ layers is enhanced to cause injection of holes from the $p_1$ layer. The injected holes diffuse through the $n_1$ layer to reach the $p_2$ layer, thus increasing the potential of the $p_2$ layer. With increase in the potential of the $p_2$ layer, the quantity of electrons brought through the p-n junction between $p_2$ and $n_2$ layers into the $n_1$ layer is increased. The electrons reaching the $n_1$ layer have the effect of reducing the $n_1$ layer side potential on the $p_1$-$n_1$ junction to promote injection of holes from the $p_1$ layer. As a result of the above sequence of internal positive feedback actions, the n-p junction between the $n_1$ and $p_2$ layers, which has previously been reversely biased, is switched into the forward bias state. This means that the thyristor, which has been previously in the forward blocking state, is brought into conduction state, that is, it is turned on.

The second ignition mode occurs when closing the switch 79 in the second series circuit. It is assumed that the thyristor is held in the forward blocking state as mentioned earlier. When the switch 79 is closed, gate current is caused to pass laterally through the $n_3$ layer from the gate electrode 69 to the anode electrode 67, thus setting up a lateral potential gradient, which is opposite to the potential gradient in the previous case, along the lateral resistance path formed in the $n_3$ layer. Thus, injection of electrons from the $n_3$ layer into the adjacent $p_1$ layer takes place this time in the vicinity of point B. The injected electrons give rise to the aforementioned internal feedback action in the vicinity of point B, so that the n-p junction between $n_1$ and $p_2$ layers, which has previously been reversely biased, is switched into the forward bias state, that is, the thyristor is turned on.

It will be apparent that the same sequence of actions as described above takes place in the thyristor of FIG. 6.

As has been shown, the thyristors of FIGS. 6 and 7 have a very useful merit in that they can be turned on by merely giving a control signal of a predetermined level between the gate and anode electrodes irrespective of the polarity of the control signal.

These thyristors, like the thyristors of FIGS. 1 and 3, may be applied to the a-c power control circuit of FIG. 4, and they can also be fabricated as part of a bilateral three-terminal thyristor.

Figure 8:
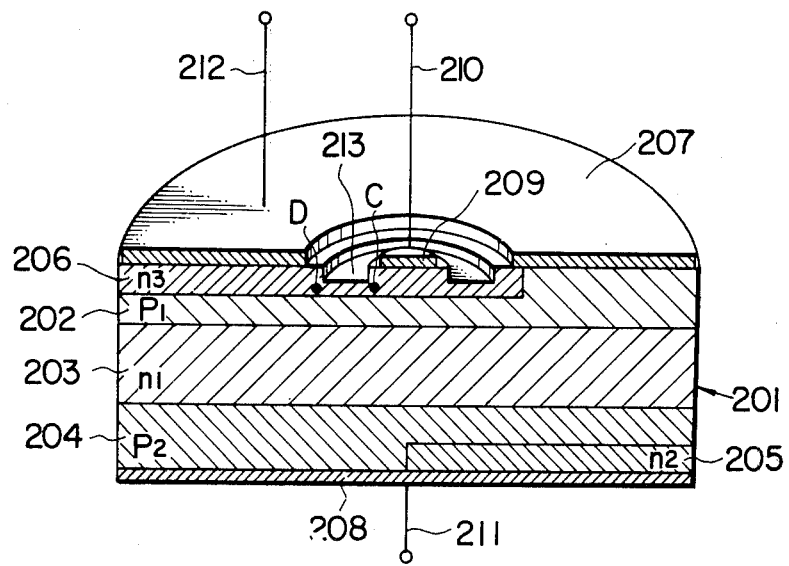
FIG. 8 is a pictorial perspective view of a section of a bilateral three-terminal thyristor including the thyristor structure of FIG. 6.

FIG. 8 shows a bilateral three-terminal thyristor structure similar to the FIG. 5 structure. In this structure, the right hand half corresponds to the anode gate thyristor of FIG. 6, and the left hand half corresponds to the usual cathode gate thyristor. In the cathode gate thyristor portion, gate electrode 209 is provided on n-type emitter layer 206 ($n_3$ layer). If the electrode 208 is held at a positive potential with respect to the electrode 207, this thyristor is turned on by impressing a control signal voltage, which is negative with respect to the electrode 207, upon the gate electrode 209.

FIGS. 9 to 13 show further embodiments of the invention.

Figure 9:
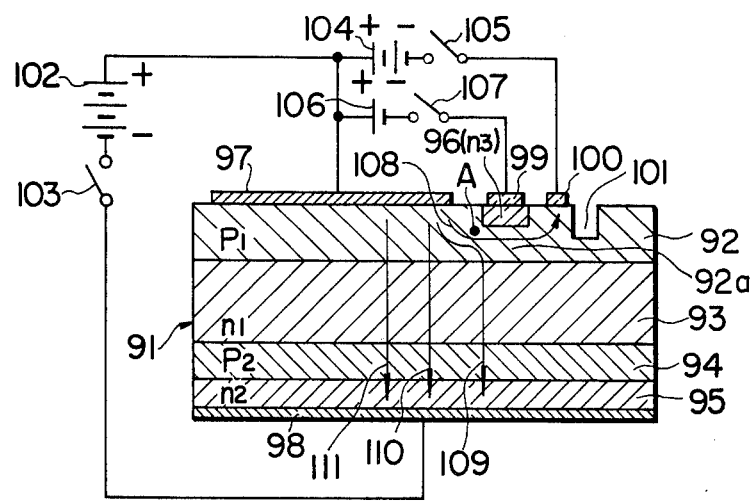
FIG. 9 is a schematic illustration of the operation of a further embodiment of the reverse blocking three-terminal thyristor according to the invention, the sectional view of the thyristor being taken along the line IX — IX in FIG. 10.
Figure 10:
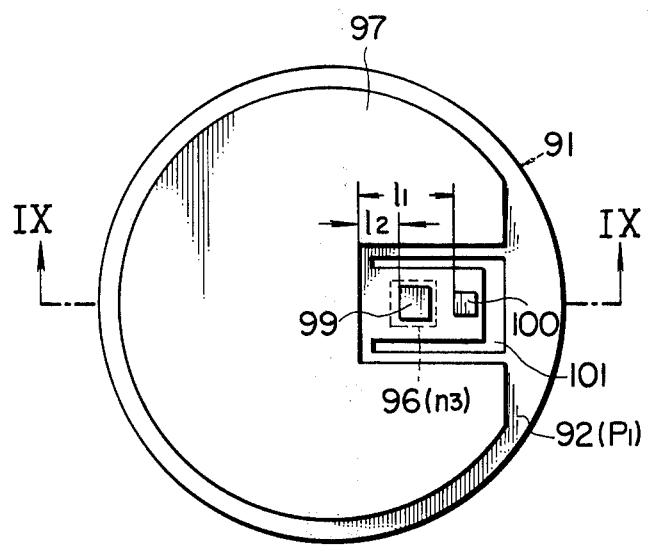
FIG. 10 is a plan view of the thyristor shown in FIG. 9.

FIGS. 9 and 10 show a reverse blocking four-terminal thyristor, in sectional view in FIG. 9 and in top view in FIG. 10. Reference numeral 91 generally designates a semiconductor substrate consisting of a first p-type layer 92 ($p_1$ layer), a first n-type layer 93 ($n_1$ layer), a second p-type layer 94 ($p_2$ layer), and a second n-type layer 95 ($n_2$ layer). These layers are stacked together with one layer contiguous to the next layer, and they define three p-n junctions. A metal layer serving as anode electrode 97 is formed by means of, for instance, vacuum deposition method on a major portion of the surface of the $p_1$ layer. Another metal layer serving as cathode electrode 98 is formed similarly on the entire surface of the opposite side $n_2$ layer. A third n-type layer 96 ($n_3$ layer) is formed in a superficial portion of the $p_1$ layer, and a gate electrode 99 is formed atop the $n_3$ layer 96. A channel-shaped groove 101 is formed by means of photoetching on a superficial portion of the $p_1$ layer 92 to surround the $n_3$ layer 96. Between the $n_3$ layer 96 and groove 101 an auxiliary electrode layer 100 is formed atop the $p_1$ layer in ohmic contact therewith. The groove 101 serves to confine the lateral current path between the anode electrode 97 and auxiliary electrode 100 within a lower part of the $n_3$ layer. The $p_1$, $p_2$, $n_2$ and $n_3$ layers may be formed by the diffusion method.

In the operation of the thyristor of FIG. 9, a main power supply 102 and a switch 103 are connected in series between the anode and cathode electrodes 97 and 98, an auxiliary power supply 104 and a switch 105 is connected in series between the anode and auxiliary electrodes 97 and 100, and a control signal source 106 and a switch 107 are connected in series between the anode and gate electrodes 97 and 99. When the switch 103 is closed, the p-n junction between $p_1$ and $n_1$ layers and p-n junction between $p_2$ and $n_2$ layers are forwardly biased, while the n-p junction between $n_1$ and $p_2$ layers is reversely biased, so that the thyristor is held in the forward blocking state. By subsequently closing the switch 105, lateral current 108 is caused to pass from the anode electrode 97 to the auxiliary electrode 100, thus producing a voltage drop, and hence a lateral potential gradient, due to the lateral resistance in the auxiliary region. Denoting the voltage of the power supply 104 by $V_{14}$ and lateral resistance by R, the lateral current is defined as $V_{14}/R$. By the formation of the groove 101 the resistance R is made sufficiently large, so that the lateral current is sufficiently small. In this embodiment, the potential $V_A$ at point A within the $p_1$ layer based on the anode electrode 97 is expressed as $$V_A \doteqdot (l_2/l_1)V_{14}$$

where $l_1$ is the distance between anode electrode and auxiliary electrode, and $l_2$ is the distance between anode electrode and gate electrode. Subsequently, by closing the switch 107 a signal is impressed on the gate electrode 96. If $V_{16} < V_A$, where $V_{16}$ is the voltage of the signal source 106, the p-n junction between $p_1$ and $n_3$ layers is reversely biased, so that the control signal current is substantially zero except for the junction leakage current. If $V_{16} > V_A$, the $p_1$-$n_3$ junction is forwardly biased, so that injection of electrons from the $n_3$ layer into the $p_1$ layer takes place. Particularly, if $V_{16} - V_A > 0.7$ (volt), the quantity of injected electrons is extremely increased, and part of injected electrons reach the $n_1$ layer 13, so that the forward bias across the p-n junction between $p_1$ and $n_1$ layers is partly increased in the vicinity of point A. As a result, the holes injected through the $p_1$-$n_1$ junction into the $n_1$ layer reaches $n_1$-$p_2$ junction to increase the potential of the $p_2$ layer so as to promote injection of electrons through the $p_2$-$n_2$ junction. Thus, the potential of the $n_1$ layer is further reduced. As a result of this sequence of internal positive feedback actions, the $n_1$-$p_2$ junction is turned into the forward bias state, so that the thyristor is turned on. The main current initially flows in the direction of arrow 109, and it develops as indicated by arrows 110 and 111. It eventually flows through the entire region between the anode and cathode electrodes 97 and 98. Of course, the time required from the closing of the switch 107 until the entire region between the anode and cathode electrodes is rendered to carry current is extremely small.

As has been described, the lateral current can be sufficiently reduced by increasing the resistance R. Thus, the power consumption $V_{14}^2/R$ of the auxiliary power source can be made sufficiently small. On the other hand, the power consumed in the control signal circuit during the period during which $V_{16} < V_A$ is substantially zero since the p-n junction between $p_1$ and $n_3$ layers is reversely biased. During the period during which $V_{16} > V_A$, the electrons injected from the $n_3$ layer modulate the conductivity of the $p_1$ layer to increase the control signal current. However, the power consumption is not increased so much since the voltage difference between the anode electrode 97 and gate electrode 99 is reduced down to substantially the forward bias voltage across the $p_1$-$n_3$ junction. It is apparent, however, that in order to turn on the thyristor a sufficiently large signal $V_{16} > V_A$ ($V_A$ being variable by $l_2/l_1$ and $V_{14}$) is required.

It is to be emphasized that in the preceding embodiment, since the threshold voltage for turning on the thyristor is high, there is no possibility for the thyristor to be turned on by its mal-functioning due to noise from the gate circuit. Also, the control signal power can be very small.

Figure 11:
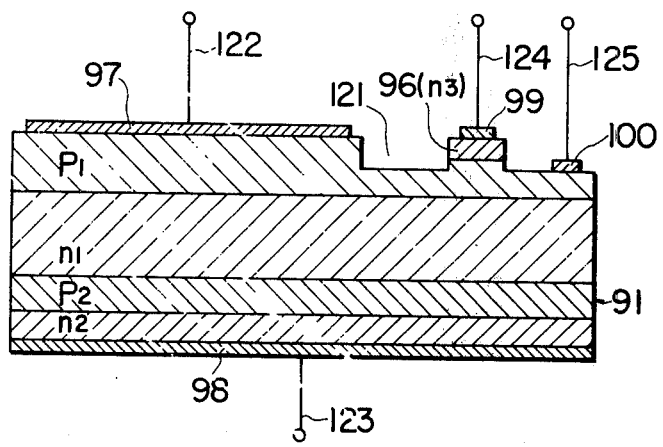
FIG. 11 is a pictorial sectional view showing a modification of the embodiment of FIG. 9.

The FIG. 11 embodiment is a modification of the reverse blocking four-terminal thyristor of FIG. 9.

In this thyristor, a recess 121 is formed in a superficial portion of the $p_1$ layer surrounding the $n_3$ layer 96 to further increase the lateral resistance of the current path from the anode electrode 97 to the auxiliary electrode 100. The operation and effects are the same as in the thyristor of the preceding embodiment.

Figure 12:
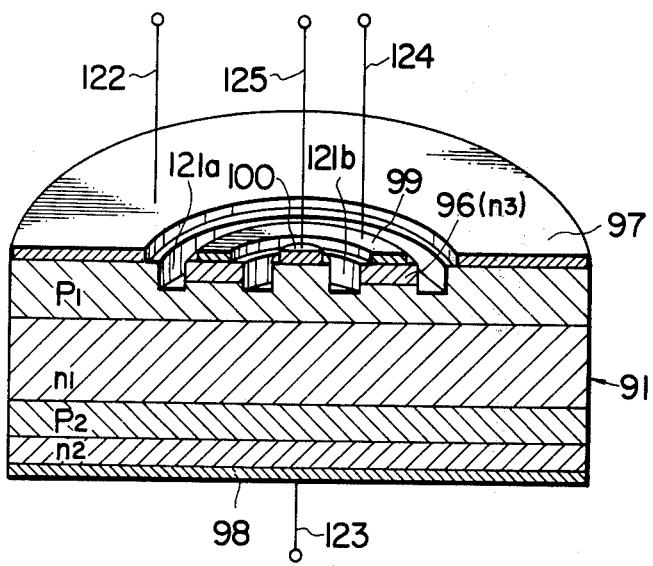
FIG. 12 is a pictorial perspective view showing another modification of the embodiment of FIG. 9.

The FIG. 12 embodiment is a ring gate thyristor as a further modification of the FIG. 9 embodiment.

In this thyristor, first and second annular recesses or grooves 121a and 121b are formed in superficial portions of the $p_1$ layer along the outer and inner peripheries of a ring-like gate electrode 99 to provide respective lateral resistance paths. The operation and effects are the same as in the thyristor of the FIG. 9 embodiment.

Figure 13:
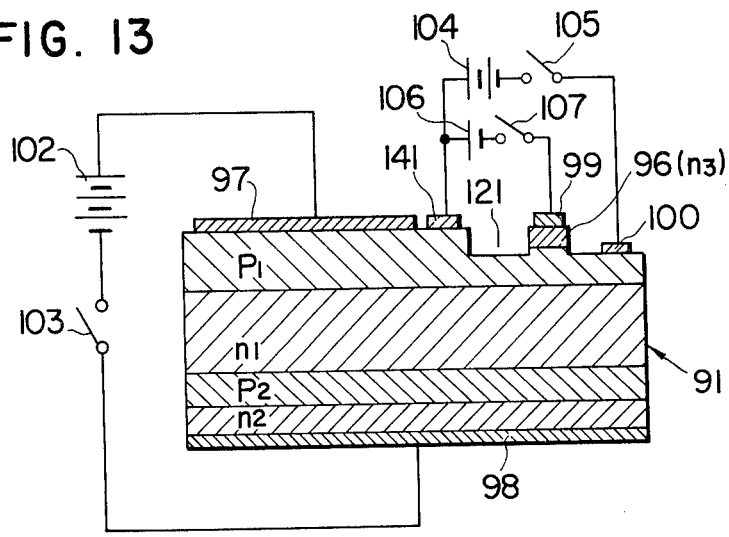
FIG. 13 is a schematic view showing a further modification of the embodiment of FIG. 9.

The FIG. 13 embodiment is a five-terminal thyristor including a second auxiliary electrode 141 formed separately from the first auxiliary electrode 100 and anode electrode 97.

Similar to the FIG. 11 embodiment, a recess 121 is formed to obtain a high lateral resistance.

Unlike the previous embodiments of FIGS. 9, 11 and 12, in this embodiment the lateral current is caused to pass from the second auxiliary electrode 141 to the first auxiliary electrode 100. Thus, it will be apparent to one skilled in the art that the thyristor operates in the same way as the previous thyristors of FIGS. 9, 11 and 12.

Figure 14:
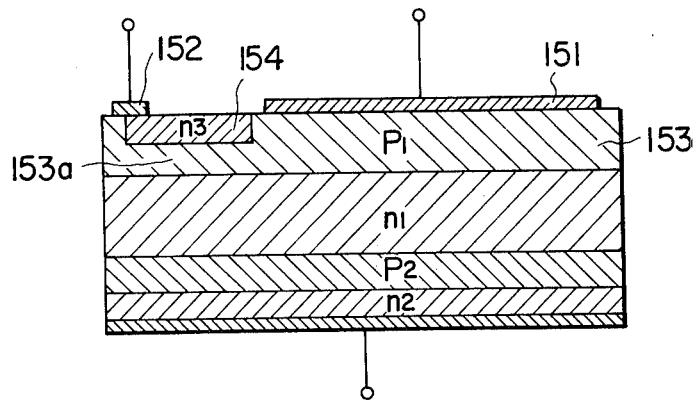
FIGS. 14 and 15 are pictorial sectional views showing still further embodiments of the reverse blocking three-terminal thyristor according to the invention.
Figure 15:
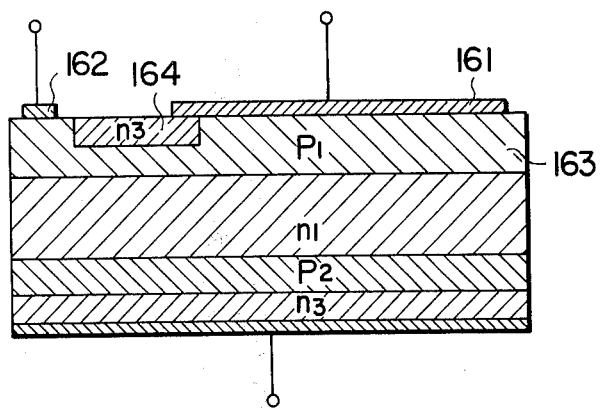

FIGS. 14 and 15 show still further embodiments of the invention. The FIGS. 14 and 15 embodiments are modifications of the thyristor of FIG. 1 or the FIG. 6.

In the thyristor of FIG. 14, a third n-type layer 154 is formed in a first p-type layer 153 between anode and gate electrodes 151 and 152 to form an auxiliary region 153a of a large lateral resistance. The third n-type layer 154 is partly contiguous to the gate electrode 152.

In the thyristor of FIG. 15, a third n-type layer 164 is formed in a first p-type layer 163 between anode and gate electrodes 161 and 162 for the formation of an auxiliary region of a large lateral resistance. The third n-type layer is partly contiguous to the anode electrode 161.

The ignition mechanism of the FIG. 14 thyristor is the same as that of the thyristor of FIG. 1 when the control signal voltage impressed upon the gate electrode 152 is positive with respect to the anode electrode 151. In the converse case, it is the same as that of a remote gate thyristor (as is disclosed in the U.S. Pat. No. 3,284,684). The ignition mechanism of the FIG. 15 thyristor is the same as that of the thyristor of FIG. 1 when the control signal voltage impressed upon the gate electrode 162 is positive with respect to the anode electrode 161.

The thyristors of FIGS. 14 and 15 may again be used in an a-c power control circuit, and they may also be fabricated as part of a bilateral three-terminal thyristor.

We claim:

1. A semiconductor controlled rectifier comprising:
  a. a semiconductor substrate including first, second and third pnp-type conductivity layers in succession, a fourth n-type conductivity layer formed in part of said first p-type conductivity layer at the exposed surface thereof, and a fifth n-type conductivity layer with the exposed surface formed in a part of said third p-type conductivity layer which is not opposite to said fourth n-type conductivity layer;
  b. one main electrode in low resistance ohmic contact with said first and fourth layers;
  c. another main electrode in low resistance ohmic contact with said third and fifth layers;
  d. a gate electrode in low resistance ohmic contact exclusively with part of said first layer;
  e. a sixth n-type conductivity layer with the exposed surface formed in said layer so as to surround said gate electrode and spaced from said one main electrode and said fourth layer; and
  (f) a conductive layer for short-circuiting the first layer and the sixth layer contiguous thereto at a point adjacent and spaced apart from said fourth layer;
  wherein the part of said first layer, with which said gate electrode is in exclusive low resistance ohmic contact, is closer to the part of said first layer upon which said fifth layer projects in a direction normal to the surface thereof than it is to said sixth layer which is spaced apart therefrom.

2. A semiconductor controlled rectifier comprising:
  a. a semiconductor substrate including first, second and third pnp-type conductivity layers, a fourth layer of n-type conductivity with the exposed surface thereof formed in the first p-type conductivity layer, a fifth n-type conductivity layer with the exposed surface consisting of a first zone which is not opposite to said fourth conductivity layer and a second zone which has a smaller area than that of the first zone and is opposite to the fourth layer formed in said third p-type conductivity layer;
  b. one main electrode in low resistance ohmic contact with the first p-type conductivity layer and the fourth n-type conductivity layer;
  c. a gate electrode in low resistance ohmic contact with the interface between said first zone and said second zone of said fifth n-type conductivity layer;
  d. another main electrode in low resistance ohmic contact with said third p-type conductivity layer and said fifth n-type conductivity layer, spaced from said gate electrode, said gate electrode being surrounded by the contact portion between said another main electrode and said fifth n-type conductivity layer.

3. A semiconductor controlled rectifier according to claim 2, in which a portion between the gate electrode on said fifth layer and said another main electrode has a reduced thickness.

4. A semiconductor controlled rectifier comprising:
  a first layer of semiconductor material having a first principal surface and including a first region of p-type conductivity;
  a second layer of semiconductor material of n-type conductivity disposed in contact with and forming a first pn-junction with said first layer at the first region thereof;
  a third layer of semiconductor material of said p-type conductivity disposed in contact with and forming a second pn junction with said second layer;
  a fourth layer of semiconductor material of said n-conductivity type disposed in contact with and forming a third pn junction with a first prescribed surface area portion of said third layer and having a second principal surface;
  an anode electrode, disposed in ohmic contact with the greater part of the surface area of said first principal surface of said first layer including a surface portion of said first region thereof, for coupling a relatively positive potential to said first region;
  a cathode electrode, disposed in ohmic contact with said second principal surface of said fourth layer, for coupling a relatively negative potential to said fourth layer;
  a gate electrode, disposed in ohmic contact exclusively with said first region of said first layer of semiconductor material at a portion of said first principal surface thereof, spaced apart from said anode electrode, for coupling a gate potential, which is relatively more positive than said relatively positive potential, to the spaced apart portion of said first layer; and wherein
  said first layer further includes a second region of semiconductor material of said n-conductivity type, extending from said first principal surface into said first region of said first layer, so as to form a fourth pn junction with said first region, said second region being disposed at least between a path extending from said anode electrode through said first region to said gate electrode, and wherein said anode electrode is separated from said second region by the surface portion of said first region therebetween; and
  wherein said first layer further includes a third region of semiconductor material of said n-type conductivity type extending from said first principal surface into said first region and forming a fifth pn junction therewith, said third region being contiguous to said anode electrode along a portion thereof and being separated laterally in a direction parallel to said first principal surface from said fourth layer, and further including a conductive layer contiguous to said first principal surface of said first layer and overlapping said first and second regions, while being spaced from said anode electrode;
  whereby, in response to the application of said relatively positive potential to said anode electrode, said relatively negative potential to said cathode electrode, and said gate potential to said gate electrode, a lateral current flows laterally in a first direction from said gate electrode through said first layer beneath said second region to said anode electrode, and an initial local turn-on current flows from said anode electrode through said first layer beneath said second region, in a second direction opposite the direction of flow of said lateral current, and through said second, third and fourth layers to said cathode electrode, to develop carrier injection between said first layer and said second layer adjacent said anode electrode, so that a main current is created directly between said anode and cathode electrodes through said first, second, third and fourth layers.

5. A semiconductor controlled rectifier comprising:

a first layer of semiconductor material having a first principal surface and including a first region of p-type conductivity;

a second layer of semiconductor material of n-type conductivity disposed in contact with and forming a first pn junction with said first layer at the first region thereof;

a third layer of semiconductor material of said p-type conductivity disposed in contact with and forming a second pn junction with said second layer;

a fourth layer of semiconductor material of said n-conductivity type disposed in contact with and forming a third pn junction with a first prescribed surface area portion of said third layer and having a second principal surface;

an anode electrode, disposed in ohmic contact with a relatively large selected surface area portion of said first principal surface of said first layer including a surface portion of said first region thereof, for coupling a relatively positive potential to said first region;

a cathode electrode, disposed in ohmic contact with said second principal surface of said fourth layer, for coupling a relatively negative potential to said fourth layer;

an auxiliary electrode, disposed in ohmic contact with said first layer of semiconductor material at a portion of said first principal surface thereof, spaced apart from said anode electrode, for coupling a potential, which is relatively negative from said relatively positive potential, to the spaced apart portion of said first layer; and wherein said first layer further includes a second region of semiconductor material of said n-conductivity type, extending from said first principal surface into said first region of said first layer, so as to form a fourth pn junction with said first region, said second region being disposed at least between a path extending from said anode electrode through said first region to said auxiliary electrode, and wherein said anode electrode is separated from said second region by the surface portion of said first region therebetween and is disposed exclusively in ohmic contact with said first region of said first layer;

and further including a gate electrode, for coupling a gate potential to said second region relatively negative with respect to the potential coupled to said anode electrode and relatively different from the potential coupled to said auxiliary electrode, disposed in ohmic contact with said first principal surface of said first layer, so that said gate electrode is disposed between said anode electrode and said auxiliary electrode.

6. A semiconductor controlled rectifier according to claim 5, wherein said first region further includes a groove extending from a portion thereof adjacent the edge of said anode around said second region and the portion of said first region beneath said auxiliary electrode.

7. A semiconductor controlled rectifier according to claim 5, further including an additional auxiliary electrode disposed in ohmic contact with said first principal surface of said first region so that said additional auxiliary electrode is disposed between said gate electrode and said anode electrode.

8. A semiconductor controlled rectifier according to claim 7, wherein said first region further includes a groove extending from a portion thereof adjacent the edge of said additional auxiliary electrode around said second region, with said first-mentioned auxiliary electrode disposed in said groove.

* * * * *